United States Patent
Cheng et al.

(10) Patent No.: US 10,170,499 B2
(45) Date of Patent: Jan. 1, 2019

(54) FINFET DEVICE WITH ABRUPT JUNCTIONS

(71) Applicant: International Business Machines Corporation, Armonk, NY (US)

(72) Inventors: Kangguo Cheng, Schenectady, NY (US); Hong He, Schenectady, NY (US); Ali Khakifirooz, Mountain View, CA (US); Alexander Reznicek, Troy, NY (US); Soon-Cheon Seo, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/809,122

(22) Filed: Nov. 10, 2017

(65) Prior Publication Data

US 2018/0097017 A1    Apr. 5, 2018

Related U.S. Application Data

(63) Continuation of application No. 14/174,914, filed on Feb. 7, 2014, now Pat. No. 9,837,440.

(51) Int. Cl.
| | |
|---|---|
| *H01L 27/12* | (2006.01) |
| *H01L 29/78* | (2006.01) |
| *H01L 29/66* | (2006.01) |
| *H01L 21/8234* | (2006.01) |
| *H01L 29/04* | (2006.01) |

(Continued)

(52) U.S. Cl.
CPC .. *H01L 27/1211* (2013.01); *H01L 21/823412* (2013.01); *H01L 29/04* (2013.01); *H01L 29/16* (2013.01); *H01L 29/66545* (2013.01); *H01L 29/66795* (2013.01); *H01L 29/785* (2013.01); *H01L 29/165* (2013.01)

(58) Field of Classification Search
CPC ............................................... H01L 21/823412
See application file for complete search history.

(56) References Cited

U.S. PATENT DOCUMENTS

| | | | |
|---|---|---|---|
| 7,915,693 B2 | 3/2011 | Okano | |
| 8,362,572 B2 | 1/2013 | Huang et al. | |
| 8,362,574 B2 | 1/2013 | Kawasaki et al. | |

(Continued)

*Primary Examiner* — Thao X Le
*Assistant Examiner* — Geoffrey Ida
(74) *Attorney, Agent, or Firm* — Scully, Scott, Murphy & Presser, P.C.; Steven J. Meyers

(57) ABSTRACT

A plurality of semiconductor fins is formed on a surface of an insulator layer. Gate structures are then formed that are orientated perpendicular and straddle each semiconductor fin. A dielectric spacer is then formed on vertical sidewalls of each gate structure. Next, an etch is performed that removes exposed portions of each semiconductor fin and a portion of the insulator layer not protected by the dielectric spacers and the gate structures. The etch provides semiconductor fin portions that have exposed vertical sidewalls. A doped semiconductor material is then formed from each exposed vertical sidewall of each semiconductor fin portion, followed by an anneal which causes diffusion of dopants from the doped semiconductor material into each semiconductor fin portion and the formation of source/drain regions. The source/drain regions are present along the sidewalls of each semiconductor fin portion and are located beneath the dielectric spacers.

17 Claims, 7 Drawing Sheets

(51) Int. Cl.
*H01L 29/16* (2006.01)
*H01L 29/165* (2006.01)

(56) References Cited

U.S. PATENT DOCUMENTS

| | | | |
|---|---|---|---|
| 2001/0024858 A1* | 9/2001 | Schulz | H01L 29/66666 438/268 |
| 2002/0052059 A1 | 5/2002 | Lyu | |
| 2004/0063286 A1* | 4/2004 | Kim | H01L 21/823412 438/283 |
| 2008/0265281 A1 | 10/2008 | Chen et al. | |
| 2010/0038679 A1* | 2/2010 | Chan | H01L 29/66795 257/190 |
| 2011/0298058 A1 | 12/2011 | Kawasaki et al. | |
| 2012/0280250 A1* | 11/2012 | Basker | H01L 21/823821 257/77 |
| 2013/0056827 A1 | 3/2013 | Tsai et al. | |
| 2013/0320455 A1* | 12/2013 | Cappellani | H01L 29/66795 257/368 |
| 2014/0134814 A1 | 5/2014 | Wong | |
| 2015/0035069 A1 | 2/2015 | Hung et al. | |
| 2015/0162433 A1 | 6/2015 | Loubet | |

* cited by examiner

FINFET DEVICE WITH ABRUPT JUNCTIONS

BACKGROUND

The present application relates to a semiconductor structure and a method of forming the same. More particularly, the present application relates to a FinFET device having abrupt junctions between the source/drain region and the channel, and a method of forming such a FinFET device.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs), is the next step in the evolution of CMOS devices. FinFETs are non-planar semiconductor devices which include at least one semiconductor fin protruding from a surface of a substrate. A gate dielectric can be formed in direct physical contact with each vertical sidewall of the at least one semiconductor fin and, optionally, in direct physical contact with a topmost surface of the semiconductor fin. A gate conductor can be formed on the gate dielectric and straddling a portion of the at least one semiconductor fin. FinFETs can increase the on-current per unit area relative to planar field effect transistors.

SUMMARY

A plurality of semiconductor fins is formed on a surface of an insulator layer. Gate structures are then formed that are orientated perpendicular and straddle each semiconductor fin. A dielectric spacer is then formed on vertical sidewalls of each gate structure. An etch is then performed that removes exposed portions of each semiconductor fin and a portion of the insulator layer not protected by dielectric spacers and gate structures. The etch provides semiconductor fin portions that have exposed vertical sidewalls. A doped semiconductor material is then formed from each exposed vertical sidewall of each semiconductor fin portion, followed by an anneal which causes diffusion of dopants from the doped semiconductor material into each semiconductor fin portion and the formation of source/drain regions. The source/drain regions are present along the sidewalls of each semiconductor fin portion and are located beneath the dielectric spacers.

In one aspect of the present application, a method of forming a FinFET device having abrupt junctions is provided. In one embodiment, the method includes providing a plurality of semiconductor fins on a surface of an insulator layer. A plurality of gate structures is formed orientated perpendicular to and straddling each semiconductor fin of the plurality of semiconductor fins. A dielectric spacer is then provided on vertical sidewalls of each gate structure. Portions of each semiconductor fin and a portion of the insulator layer are then removed utilizing each dielectric spacer and each gate structure as an etch mask. This removing provides semiconductor fin portions located on pedestal insulator portions of the insulator layer. A source-side doped semiconductor material portion is formed on one exposed vertical sidewall of each semiconductor fin portion and a drain-side doped semiconductor portion is formed on another exposed vertical sidewall of each semiconductor fin portion. Next, a dopant from the source-side doped semiconductor material portion is diffused into each semiconductor fin portion to form a source region along the one exposed vertical sidewall of each semiconductor fin portion, and a dopant is diffused from the drain-side doped semiconductor material portion into each semiconductor fin portion to form a drain region along the another exposed vertical sidewall of each semiconductor fin portion.

In another aspect of the present application, a FinFET device having abrupt junctions is provided. In one embodiment, the FinFET device includes a plurality of semiconductor fin portions located on a plurality of pedestal insulator portions of an insulator layer, wherein each semiconductor fin portion of the plurality of semiconductor portions is located directly on and above one of the pedestal insulator portions of the plurality of pedestal insulator portions. The FinFET device further includes a plurality of functional gate structures orientated perpendicular to and straddling each semiconductor fin portion. The FinFET device of the present application further includes a dielectric spacer located on vertical sidewalls of each functional gate structure, wherein each dielectric spacer has outer sidewalls that are vertical coincident to vertical sidewalls of each semiconductor fin portion and vertical sidewalls of each pedestal insulator portion. A source-side doped semiconductor material portion is located on one vertical sidewall of each semiconductor fin portion and on one side of each functional gate structure, and a drain-side doped semiconductor portion is located on another vertical sidewall of each semiconductor fin and on another side of each gate structure. A source region is located in each semiconductor fin portion and along the one vertical sidewall of each semiconductor fin portion, and a drain region is located in each semiconductor fin portion and along the another vertical sidewall of each semiconductor fin portion.

DETAILED DESCRIPTION

Figure 1A:
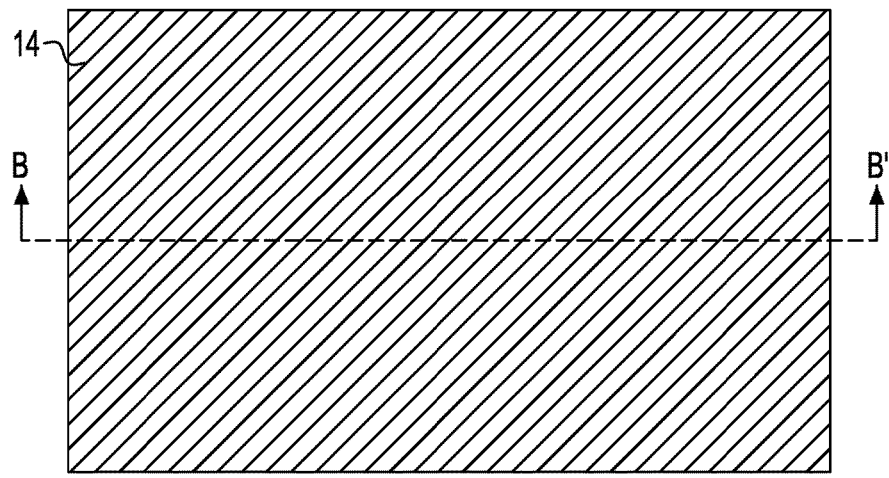
FIG. 1A is a top-down view of an exemplary semiconductor structure including, from bottom to top, a handle substrate, an insulator layer and a semiconductor material layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

As complementary metal oxide semiconductor (CMOS) technology is pushed to smaller device pitch, conventional junction engineering is challenging. The challenge is in the formation of the junction from the source region (or drain region) to the device channel. Leaving semiconductor fins standing in the source region and the drain region and merging the semiconductor fins with highly doped epitaxy, as pursued in 14 nm technology, does not work for the junction very well. The doped epitaxy semiconductor material is too far away from the channel and diffusion does not form sharp junctions required for outstanding device performance. By "sharp junctions" it is meant the junction gradient is less than 6 nm per decade of doping concentration change, more preferably less than 4 nm per decade. Moreover, the proposed partial recess with leaving i.e., 5 nm semiconductor fins standing and growing a doped semiconductor material from there is not manufacturable on a repeated basis. The present application provides a method of forming FinFET devices having sharp junctions and which can be manufactured on a consistence and repeated basis.

Figure 1B:
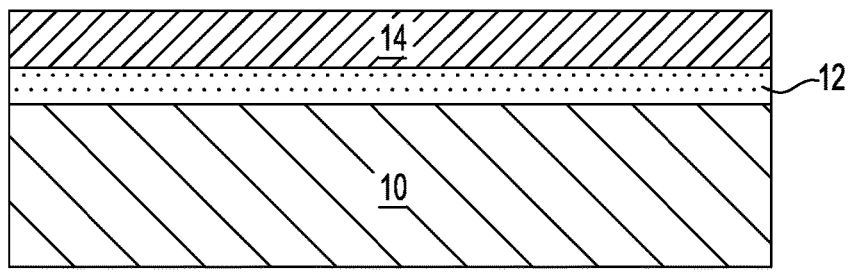
FIG. 1B is a cross sectional view of the exemplary semiconductor structure of FIG. 1A along the vertical plane B-B'.

Referring first FIGS. 1A-1B, there are illustrated an exemplary semiconductor structure including, from bottom to top, a handle substrate 10, an insulator layer 12 and a semiconductor material layer 14 that can be employed in accordance with an embodiment of the present application. Collectively, the handle substrate 10, the insulator layer 12 and the semiconductor material layer 14 may be referred to as a semiconductor-on-insulator (SOI) substrate. In some embodiments of the present application, the handle substrate 10 can be omitted.

In the embodiment illustrated in FIGS. 1A-1B, the semiconductor material layer 14 is present on an uppermost surface of the insulator layer 12. The insulator layer 12 is present on an uppermost surface of the handle substrate 10. The handle substrate 10 provides mechanical support to the insulator layer 12 and the semiconductor material layer 14.

In some embodiments of the present application, the handle substrate 10 and the semiconductor material layer 14 of the SOI substrate may comprise a same semiconductor material. In other embodiments of the present application, the handle substrate 10 and the semiconductor material layer 14 of the SOI substrate may comprise a different semiconductor material. The term "semiconductor" as used herein in connection with the semiconductor material of the handle substrate 10 and the semiconductor material layer 14 denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate 10 and the semiconductor material layer 14. In one embodiment, the handle substrate 10 and the semiconductor material layer 14 are both comprised of silicon. In some embodiments, the handle substrate 10 is a non-semiconductor material including, for example, a dielectric material and/or a conductive material.

The handle substrate 10 and the semiconductor material layer 14 may have the same or different crystal orientation. For example, the crystal orientation of the handle substrate 10 and/or the semiconductor material layer 14 may be {100}, {110}, or {111}. Other crystallographic orientations besides those specifically mentioned can also be used in the present application. The handle substrate 10 and/or the semiconductor material layer 14 of the SOI substrate may be a single crystalline semiconductor material, a polycrystalline material, or an amorphous material. Typically, at least the semiconductor material layer 14 is a single crystalline semiconductor material. In some embodiments, the semiconductor material layer 14 that is located atop the insulator layer 12 can be processed to include semiconductor regions having different crystal orientations.

The insulator layer 12 of the SOI substrate may be a crystalline or non-crystalline oxide or nitride. In one embodiment, the insulator layer 12 is an oxide such as, for example, silicon dioxide. The insulator layer 12 may be continuous or it may be discontinuous. When a discontinuous insulator region is present, the insulator region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together.

The optional thinning step reduces the thickness of the semiconductor material layer 14 to a layer having a thickness that is more desirable.

The thickness of semiconductor material layer 14 of the SOI substrate is typically from 10 nm to 100 nm, with a thickness from 50 nm to 70 nm being more typical. In some embodiments, and when an ETSOI (extremely thin semiconductor-on-insulator) substrate is employed, semiconductor material layer 14 of the SOI can have a thickness of less than 10 nm. If the thickness of the semiconductor material layer 14 is not within one of the above mentioned ranges, a thinning step such as, for example, planarization or etching can be used to reduce the thickness of semiconductor material layer 14 to a value within one of the ranges mentioned above. The insulator layer 12 of the SOI substrate typically has a thickness from 1 nm to 200 nm, with a thickness from 100 nm to 150 nm being more typical. The thickness of the handle substrate 10 of the SOI substrate is inconsequential to the present application.

The semiconductor material layer 14 may be doped, undoped or contain doped and undoped regions therein. For clarity, the doped regions are not specifically shown in the drawings of the present application. Each doped region within the semiconductor material layer 14 may have the same, or they may have different conductivities and/or doping concentrations. The doped regions that are present in the semiconductor material layer 14 can be formed by ion implantation process or gas phase doping.

In some embodiments of the present application, a layer of hard mask material (not shown) such, as for example, silicon dioxide and/or silicon nitride, can be deposited on the exposed surface of the semiconductor material layer 14 prior to forming each semiconductor fin. During the subsequent formation of the semiconductor fins, a portion of the hard mask provides a fin cap on a topmost surface of each fin. In such a structure, the gate dielectric material portion to be subsequently formed is present only along the vertical sidewalls of each semiconductor fin. In the embodiment that is illustrated, no fin cap is present and as such, the gate dielectric material portion is present along the vertical sidewalls and on a topmost surface of each semiconductor fin.

Figure 2A:
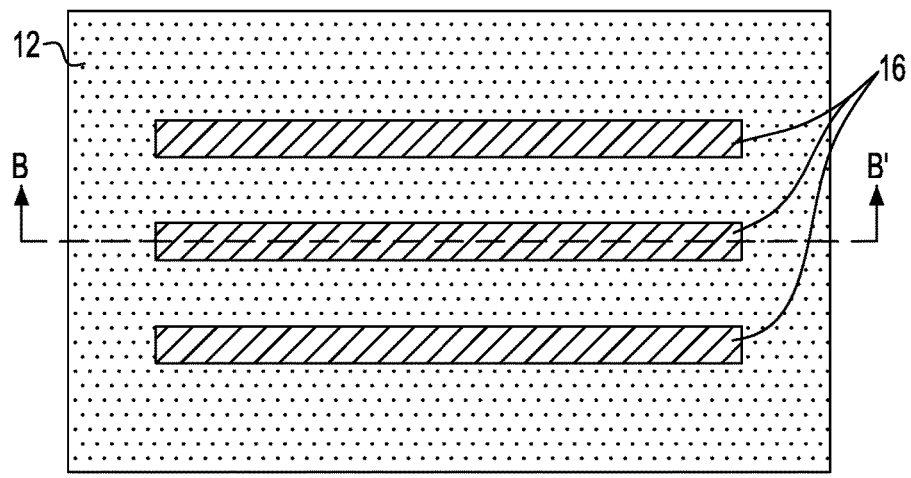
FIG. 2A is a top-down view of the exemplary semiconductor structure of FIG. 1A after forming a plurality of semiconductor fins.
Figure 2B:
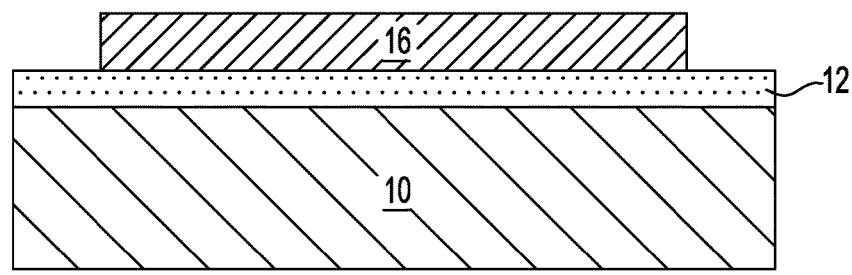
FIG. 2B is a cross sectional view of the exemplary semiconductor structure of FIG. 2A along the vertical plane B-B'.

Referring now to FIGS. 2A-2B, there are illustrated the exemplary semiconductor structure of FIGS. 1A-1B after forming a plurality of semiconductor fins. In the illustrated embodiment of the present application, each semiconductor fin 16 of the plurality of semiconductor fins has a bottommost surface that is located on a surface of the insulator layer 12. Thus, and in the illustrated embodiment, each semiconductor fin 16 is formed on a surface of a substrate that is provided by insulator layer 12. In such an embodiment, an interface is present between the bottommost surface of each semiconductor fin 16 and an upper surface of the insulator layer 12.

In the illustrated embodiment of the present application, each semiconductor fin 16 that is formed comprises a same semiconductor material as that of the semiconductor material layer 14. Each semiconductor fin 16 of the plurality of semiconductor fins is spaced apart from its nearest neighboring semiconductor fin(s) 16. Also, each semiconductor fin 16 of the plurality of semiconductor fins is oriented parallel to each other. While the present application is illustrated with a plurality of semiconductor fins, embodiments in which a single semiconductor fin 16 is employed in lieu of a plurality of semiconductor fins are expressly contemplated herein.

As used herein, a "semiconductor fin" refers to a contiguous structure including a semiconductor material and including a pair of vertical sidewalls that are parallel to each other. As used herein, a surface is "vertical" if there exists a vertical plane from which the surface does not device by more than three times the root mean square roughness of the surface.

In one embodiment of the present application, each semiconductor fin 16 has a height from 10 nm to 100 nm, and a width from 4 nm to 30 nm. In another embodiment of the present application, each semiconductor fin 16 has a height from 15 nm to 50 nm, and a width from 5 nm to 12 nm.

The semiconductor structure shown in FIGS. 2A-2B can be formed by lithography and etching. Lithography can include forming a photoresist (not shown) on the topmost surface of the layer of hard mask material (or the topmost surface of the semiconductor material layer 14 when no layer of hard mask material is present), exposing the photoresist to a desired pattern of radiation, and then developing the exposed photoresist with a conventional resist developer to provide a patterned photoresist atop the semiconductor material layer 14. At least one etch is then employed which transfers the pattern from the patterned photoresist into the semiconductor material layer 14 utilizing the underlying insulator layer 12 as an etch stop. In one embodiment, the etch used for pattern transfer may include a dry etch process such as, for example, reactive ion etching, plasma etching, ion beam etching or laser ablation. In another embodiment, the etch used for pattern transfer may include a sidewall image transfer (SIT) process. After transferring the pattern into the semiconductor material layer 14, the patterned photoresist can be removed utilizing a conventional resist stripping process such as, for example, ashing.

Figure 3A:
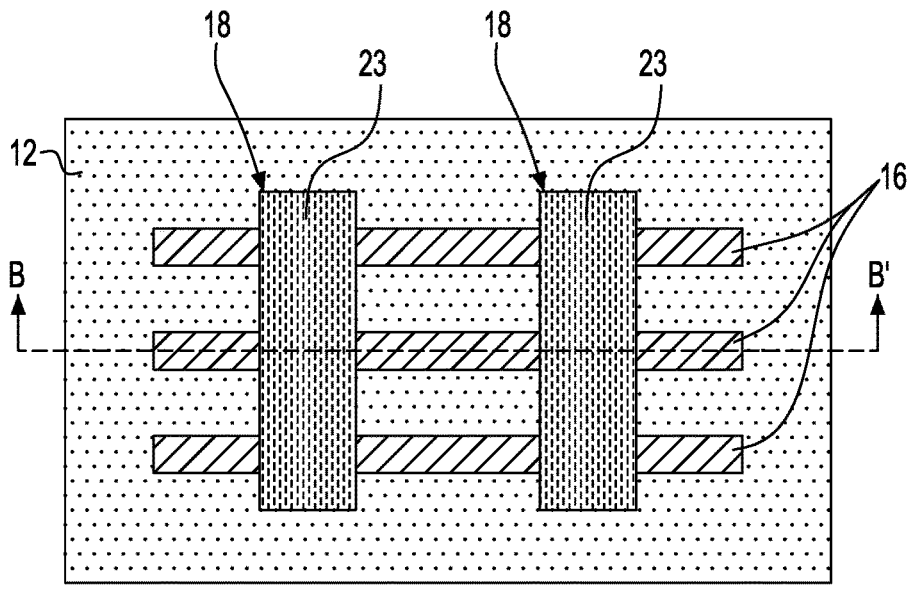
FIG. 3A is a top-down view of the exemplary semiconductor structure of FIG. 2A after forming a plurality of gate structures that are orientated perpendicular to and straddle each semiconductor fin.
Figure 3B:
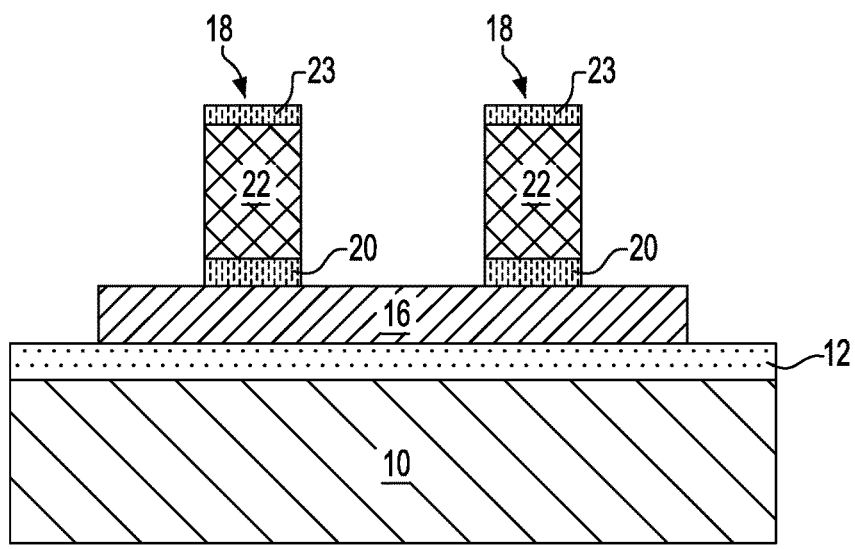
FIG. 3B is a cross sectional view of the exemplary semiconductor structure of FIG. 3A along the vertical plane B-B'.

Referring now to FIGS. 3A-3B, there are illustrated the exemplary semiconductor structure of FIGS. 2A-2B after forming a plurality of gate structures 18 that are oriented perpendicular to and that straddles each semiconductor fin 16.

Each gate structure 18 can include a functional gate structure and/or a sacrificial gate structure. The term "functional gate structure" is used throughout the present application as a permanent gate structure used to control output current (i.e., flow of carriers in the channel) of a semiconducting device through electrical or magnetic fields. The term "sacrificial gate structure" is used throughout the present application to denote a material that serves as a placeholder structure for a functional gate structure to be subsequently formed. In one embodiment, each gate structure 18 includes either a functional gate structure or a sacrificial gate structure. In yet another embodiment, a first set of gate structures can comprise a functional gate structure, while a second set of gate structures comprises a sacrificial gate structure. In such an embodiment, block mask technology can be used in forming the different gate structures. When a sacrificial gate structure is employed, the sacrificial gate structure can be replaced with a functional gate structure any time after the source and drain regions have been defined within the semiconductor fins.

In embodiments in which each gate structure 18 is a sacrificial gate structure (not shown in drawings), the sacrificial gate structure is formed by first providing a blanket layer of a sacrificial gate material. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the sacrificial gate structure.

In the embodiment illustrated in FIGS. 3A-3B, each gate structure 18 is a functional gate structure that includes a gate dielectric material portion 20 and a gate conductor material portion 22. A dielectric cap 23 can be located atop the gate conductor material portion 22. In some embodiments, dielectric cap 23 can be omitted. The functional gate structures can be formed by first providing a material stack of a gate dielectric material, a gate conductor material and a dielectric cap material. This material stack is then patterned by lithography and etching.

The gate dielectric material that provides the gate dielectric material portion 20 of the functional gate structure can be an oxide, nitride, and/or oxynitride. In one example, the gate dielectric material that provides the gate dielectric material portion 20 of the functional gate structure can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed.

The gate dielectric material used in providing the gate dielectric material portion 20 can be formed by any deposition technique including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the gate dielectric material portion 20 can have a thickness in a range from 1 nm to 10 nm. Other thicknesses that are lesser than or greater than the aforementioned thickness range can also be employed for the gate dielectric material.

The gate conductor material portion 22 comprises a gate conductor material. The gate conductor material used in providing the gate conductor material portion 22 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The gate conductor material used in providing the gate conductor material portion 22 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the gate conductor material portion 22 of the functional gate structure has a thickness from 1 nm to 100 nm. Other thicknesses that are lesser than or greater than the aforementioned thickness range can also be employed for the gate conductor material.

The dielectric cap material used in providing the dielectric cap 23 can be comprised of a dielectric oxide, nitride and/or oxynitride. In one example, silicon dioxide and/or silicon nitride can be used as the dielectric cap material. The dielectric cap material used in providing the dielectric cap 23 can be formed by a deposition process including, for example, chemical vapor deposition (CVD), plasma enhanced chemical vapor deposition (PECVD), physical vapor deposition (PVD), sputtering, or atomic layer deposition. In one embodiment of the present application, the dielectric cap material used in providing the dielectric cap 23 can have a thickness in a range from 25 nm to 100 nm. Other thicknesses that are lesser than or greater than the aforementioned thickness range can also be employed for the dielectric cap material.

Figure 4A:
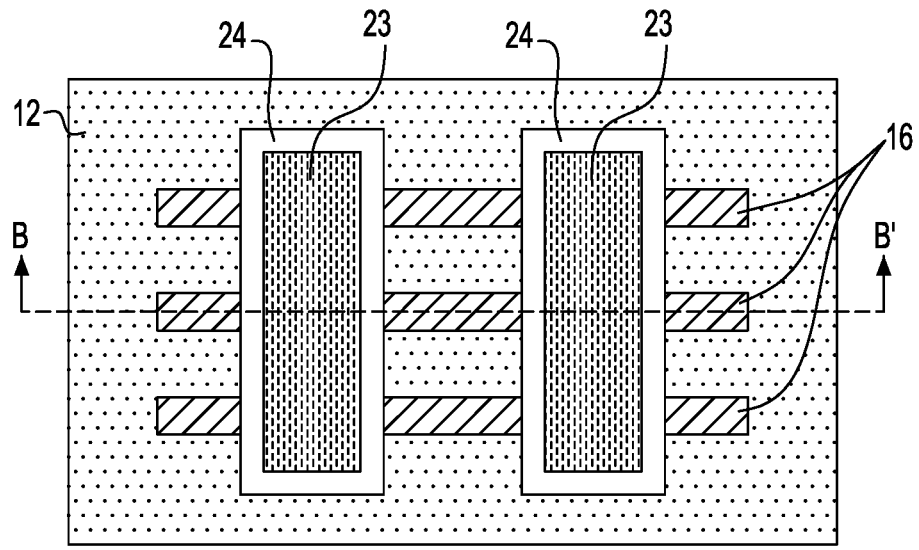
FIG. 4A is a top-down view of the exemplary semiconductor structure of FIG. 3A after forming a dielectric spacer on vertical sidewalls of each gate structure.
Figure 4B:
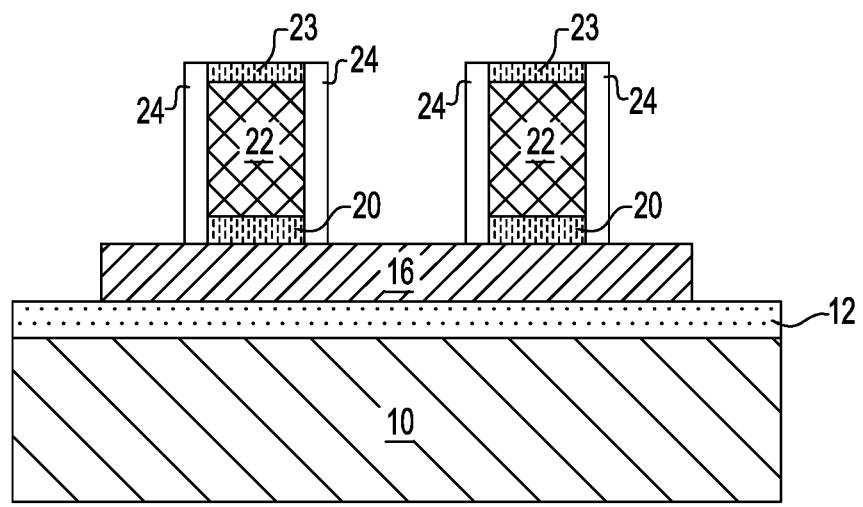
FIG. 4B is a cross sectional view of the exemplary semiconductor structure of FIG. 4A along the vertical plane B-B'.

Referring now to FIGS. 4A-4B, there are illustrated the exemplary semiconductor structure of FIGS. 3A-3B after forming a dielectric spacer 24 on vertical sidewalls of each gate structure 18. Each dielectric spacer 24 has a base, i.e., bottommost surface, which is in direct physical contact with a portion of an upper surface of each semiconductor fin 16. In some embodiments, and as shown, each dielectric spacer 24 has a topmost surface that is coplanar with an upper surface of dielectric cap 23. When no dielectric cap 23 is present, each dielectric spacer 24 has a topmost surface that is coplanar with an upper surface of the gate conductor material portion 22.

Dielectric spacer 24 can be formed by first providing a spacer material and then etching the spacer material. The spacer material may be composed of any dielectric spacer material including, for example, a dielectric oxide, dielectric nitride, and/or dielectric oxynitride. In one example, the spacer material used in providing the dielectric spacer 24 may be composed of silicon dioxide or silicon nitride. The spacer material can be provided by a deposition process including, for example, chemical vapor deposition (CVD), plasma enhanced chemical vapor deposition (PECVD), or physical vapor deposition (PVD). The etching of the spacer material may comprise a dry etch process such as, for example, a reactive ion etch.

Figure 5A:
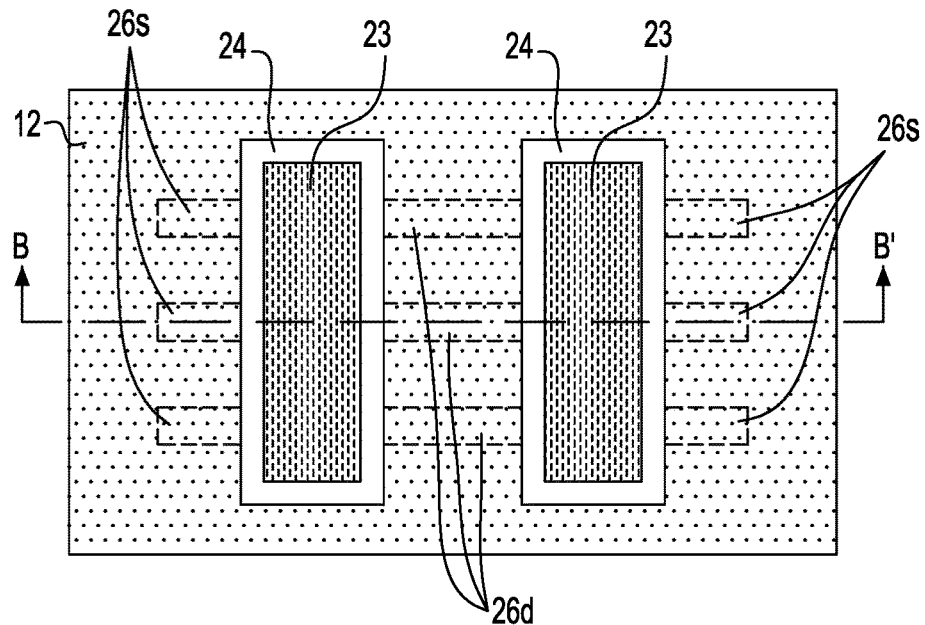
FIG. 5A is a top-down view of the exemplary semiconductor structure of FIG. 4A after recessing the fins and forming a source-side trench on one side of each gate structure extending into one portion of the insulator layer and a drain-side trench on another side of each gate structure extending into another portion of the insulator layer.
Figure 5B:
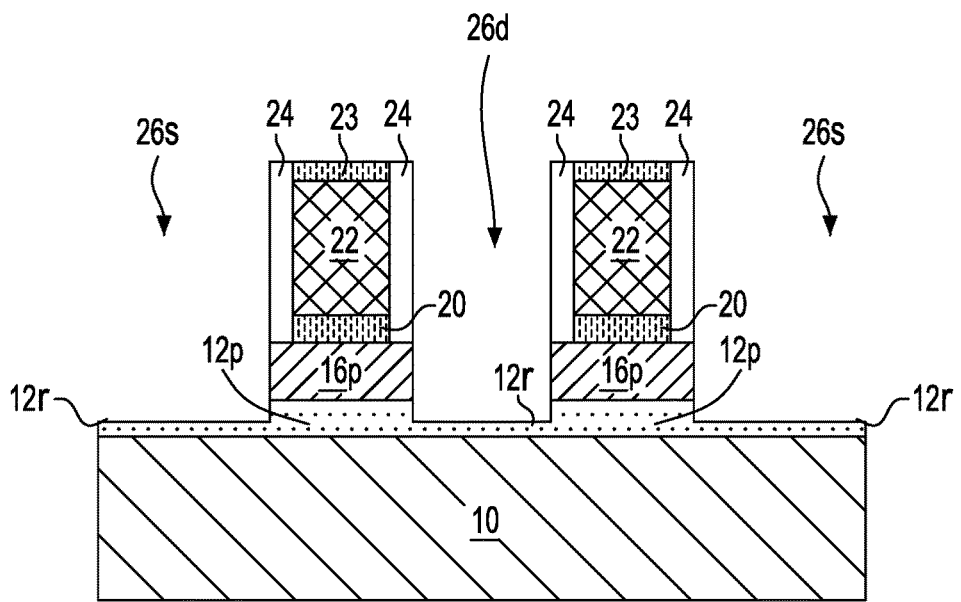
FIG. 5B is a cross sectional view of the exemplary semiconductor structure of FIG. 5A along the vertical plane B-B'.

Referring now to FIGS. 5A-5B, there are illustrated the exemplary semiconductor structure of FIGS. 4A-4B after recessing the fins and forming a source-side trench 26s on one side of each gate structure 18 extending into one portion of the insulator layer 12 and a drain-side trench 26d on another side of each gate structure 18 extending into another portion of the insulator layer 12.

Each source-side trench 26s and each drain-side trench 26d is formed by etching in which each gate structure 18 and each dielectric spacer 24 are collectively used as an etch mask. The etching first removes portions of each semiconductor fin 16 that are not protected by gate structure 18 and dielectric spacer 24, and then continues into a portion of the underlying insulator layer 12. The etch that can be used in forming the exemplary structure shown in FIGS. 5A-5B is an anisotropic etch. In one example, reactive ion etch (RIE) can be used to form the exemplary structure shown in FIGS. 5A-5B.

The remaining portions of each semiconductor fin 16 after this etch may be referred to as a semiconductor fin portion 16p. Each semiconductor fin portion 16p has exposed vertical sidewalls. The vertical sidewalls of each semiconductor fin portion 16p are vertically coincident with the outermost vertical sidewall of each dielectric spacer 24. The width of each semiconductor fin portion 16p is a sum of the width of gate structure 18 plus the width of each dielectric spacer 24 that is contact with the gate structure 18. Each vertical sidewall of each semiconductor fin portion 16p that is formed by this etch can have a <110> crystal surface.

Each semiconductor fin portion 16p is located on a non-etched portion of the insulator layer 12. This non-etched portion of the insulator layer 12 may be referred to herein as an insulator pedestal portion 12p. Each etched portion of the insulator layer 12 may be referred to herein as a recessed insulator portion 12r. Insulator pedestal portions 12p and recessed insulator portions 12r are of unitary construction, i.e., of a same piece and a same material and without any interface. Each insulator pedestal portion 12p has an upper surface that is located above and vertically offset from an upper surface of each recessed insulator portion 12r.

As is shown, the outer sidewalls of each dielectric spacer 24, vertically sidewalls of each semiconductor fin portion 16p and vertical sidewalls of each insulator pedestal portion 12p are vertically coincident to each other.

Figure 6A:
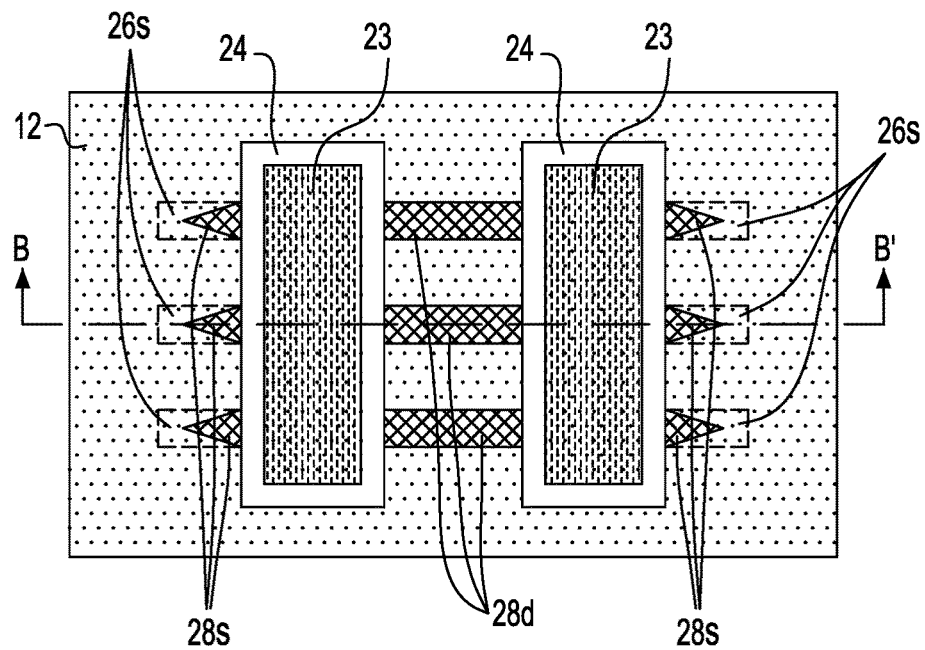
FIG. 6A is a top-down of the exemplary semiconductor structure of FIG. 5A after the formation of a doped semiconductor material from exposed vertical sidewalls of each semiconductor fin portion.
Figure 6B:
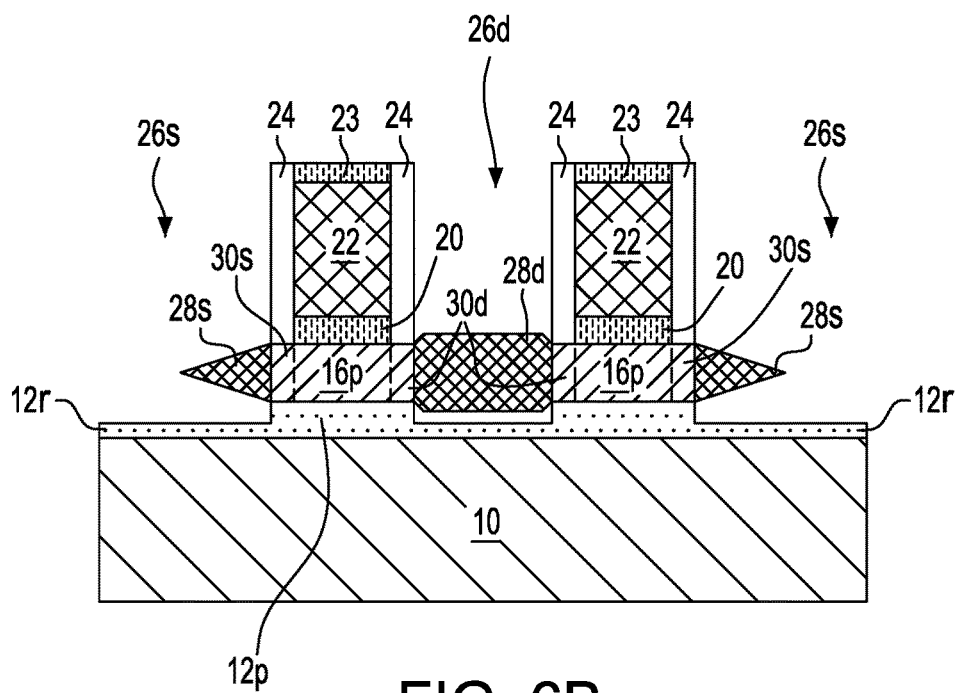
FIG. 6B is a cross sectional view of the exemplary semiconductor structure of FIG. 6A along the vertical plane B-B'.

Referring now to FIGS. 6A and 6B, there are shown the exemplary semiconductor structure of FIGS. 5A-5B after forming a doped semiconductor material from each sidewalls of each semiconductor fin portion 16p.

The doped semiconductor material that is formed from the vertical sidewalls of each semiconductor fin portion 16p and within the area including the source-side trench 26s may be referred to herein as a source-side doped semiconductor material portion 28s, while doped semiconductor material that is formed from the vertical sidewalls of each semiconductor fin portion 16p and within the area including the drain-side trench 26d may be referred to herein as a drain-side doped semiconductor material portion 28d. In accordance with the present application, the source source-side doped semiconductor material portion 28s can be used in providing a source region of the FinFET device, while the drain-side doped semiconductor material portion 28d may be used in providing a drain region of the FinFET device.

In some embodiments and as illustrated in the drawings, the drain-side doped semiconductor material portion 28d of one semiconductor fin portion 16p may merge with a drain-side semiconductor material portion 28d of an adjacent semiconductor fin portion 16p. In some embodiments (not shown in the drawings), the source-side doped semiconductor material portion 28s of one semiconductor fin portion 16p may merge with a source-side semiconductor material portion 28s of an adjacent semiconductor fin portion 16p. During an initial stage of formation of the doped semiconductor material, <111> bound diamond shaped epitaxy is grown around each semiconductor fin portion.

Once the diamond shaped epitaxy merges, <100> planes form between the diamond shaped structures, the epitaxial growth rate is much faster, resulting in a smoothed surface. In areas in which merging does not occur, the growth rate of the doped semiconductor material remains slow.

In some embodiments, the formation of the doped semiconductor material may continue providing the structure shown in FIGS. 6A-6B in which the doped semiconductor material that is formed has a non-planar top surface.

The source-side doped semiconductor material portion 28s includes an n-type (i.e., at least one element from Group VA of the Periodic Table of Elements (e.g., P and/or As)) or a p-type dopant (i.e., at least one element from Group IIIA of the Periodic Table of Elements (e.g., Al and/or B)) and at least one semiconductor material. The at least one semiconductor material of the source-side doped semiconductor material portion 28s may include any of the semiconductor materials mentioned above for semiconductor material layer 14. In one embodiment of the present application, the at least one semiconductor material of the source-side doped semiconductor material portion 28s is a same semiconductor material as that of semiconductor material layer 14. In another embodiment, the at least one semiconductor material of the source-side doped semiconductor material portion 28s is a different semiconductor material than semiconductor material layer 14. For example, when semiconductor material layer 14 is comprised of silicon, than the source-side doped semiconductor material portion 28s may be comprised of SiGe.

The drain-side doped semiconductor material portion 28d includes an n-type (i.e., at least one element from Group VA of the Periodic Table of Elements (e.g., P and/or As) or a p-type dopant (i.e., at least one element from Group IIIA of the Periodic Table of Elements (e.g., Al and/or B) and at least one semiconductor material. The at least one semiconductor material of the drain-side doped semiconductor material portion 28d may include any of the semiconductor materials mentioned above for semiconductor material layer 14. In one embodiment of the present application, the at least one semiconductor material of the drain-side doped semiconductor material portion 28d is a same semiconductor material as that of semiconductor material layer 14. In another embodiment, the at least one semiconductor material of the drain-side doped semiconductor material portion 28d is a different semiconductor material than semiconductor material layer 14. For example, when semiconductor material layer 14 is comprised of silicon, than the drain-side doped semiconductor material portion 28d may be comprised of SiGe.

In accordance with the present application, the at least one semiconductor material of the source-side doped semiconductor material portion 28s is a same semiconductor material as that of the at least one semiconductor material of the drain-side doped semiconductor material portion 28d.

The source-side doped semiconductor material portion 28s and the drain-side doped semiconductor material portion 28d can be formed by an in-situ doped epitaxial growth process. As such, the source-side doped semiconductor material portion 28s and the drain-side doped semiconductor material portion 28d have an epitaxial relationship with that of the vertical sidewall surface of the semiconductor fin portion 16p.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in forming the source-side doped semiconductor material portion 28s and the drain-side doped semiconductor material portion 28d of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the source-side doped semiconductor material portion 28s and the drain-side doped semiconductor material portion 28d typically ranges from 550° C. to 900° C. Although higher temperature typically results in faster deposition, the faster deposition may result in crystal defects and film cracking.

A number of different sources may be used for the deposition of the source-side doped semiconductor material portion 28s and the drain-side doped semiconductor material portion 28d. In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In addition to the above mentioned gases, the deposition of the source-side doped semiconductor material portion 28s and the drain-side doped semiconductor material portion 28d also includes a dopant source. In one example, the dopant source employed in forming the source-side doped semiconductor material portion 28s and the drain-side doped semiconductor material portion 28d can include phosphine ($PH_3$). In another example, the epitaxial deposition of the source-side doped semiconductor material portion 28s and the drain-side doped semiconductor material portion 28d includes a dopant gas present in a ratio to silane ($SiH_4$) ranging from 0.00001% to 2%.

In one embodiment, the dopant is present in the source-side doped semiconductor material portion 28s and the drain-side doped semiconductor material portion 28d in a concentration ranging from $1 \times 10^{19}$ atoms/cm$^3$ to $10^{21}$ atoms/cm$^3$. In another embodiment, dopant is present in the source-side doped semiconductor material portion 28s and the drain-side doped semiconductor material portion 28d in a concentration ranging $1 \times 10^{20}$ atoms/cm$^3$ to $8 \times 10^{20}$ atoms/cm$^3$. The concentration of dopant within the source-side doped semiconductor material portion 28s can be equal to, greater than, or less than the concentration of dopant within the drain-side doped semiconductor material portion 28d.

In one embodiment of the present application, the dopant can be uniformly present in the source-side doped semiconductor material portion 28s and/or the drain-side doped semiconductor material portion 28d. In another of the present application, the dopant can be present as a gradient in the source-side doped semiconductor material portion 28s and/or the drain-side doped semiconductor material portion 28d.

In some embodiments of the present application, the source-side doped semiconductor material portion 28s and/or the drain-side doped semiconductor material portion 28d can be hydrogenated. When hydrogenated, a hydrogen source is used in conjunction with the other source gases and the amount of hydrogen that is present within the source-side doped semiconductor material portion 28s and/or the drain-side doped semiconductor material portion 28d can be from 1 atomic % to 40 atomic %. In another embodiment, carbon can be present in the source-side doped semiconductor material portion 28s and/or the drain-side doped semiconductor material portion 28d. When present, a carbon source (such as, for example, mono-methylsilane) is used in conjunction with the other source gases and carbon, C, can be present in the source-side doped semiconductor material portion 28s and/or the drain-side doped semiconductor material portion 28d in range from 0 atomic % to 4 atomic %.

The thickness of the source-side doped semiconductor material portion 28s and the drain-side doped semiconductor material portion 28d may range from 2 nm to 100 nm. In another embodiment, the thickness of the source-side doped semiconductor material portion 28s and the drain-side doped semiconductor material portion 28d ranges from 5 nm to 50 nm. The source-side doped semiconductor material portion 28s may have a thickness that is equal to, greater than, or less than the thickness of the drain-side doped semiconductor material portion 28d.

After forming the source-side doped semiconductor material portion 28s and the drain-side doped semiconductor material portion 28d, an anneal is performed. The anneal causes diffusion of dopant, e.g., phosphorus, from the source-side doped semiconductor material portion 28s laterally into a portion of each semiconductor fin portion 16p forming a source region 30s, and diffusion of dopant, e.g., phosphorus, from the drain-side doped semiconductor material portion 28s laterally into another portion of each semiconductor fin portion 16p and formation of a drain region 30d. The remaining semiconductor fin portion 16p that is present between the source region 30s and the drain region 30d represents a channel region of the FinFET device of the present application. Each source region 30s is formed directly beneath a dielectric spacer 24 that is located on one side of the gate structure 18, while each drain region 30d is formed directly beneath a dielectric spacer 24 that is located on another side of the gate structure 18. Each source region 30s and each drain region 30d can have a same width as that of the overlying dielectric spacer 24. Each source region 30s is formed along one vertical sidewall of each semiconductor fin portion 16p and each drain regions 30d is formed along another vertical sidewall of each semiconductor fin portion 16p. A bottommost surface of the source region 30s and a bottommost surface of the drain region 30d are in direct contact with a topmost surface of a pedestal insulator portion 12p. The anneal process used in forming the source region 30s and the drain region 30d may be a rapid thermal anneal, furnace annealing, flash annealing, laser annealing or any suitable combination of those techniques. The annealing temperature may range from 600° C. to 1300° C. with an anneal time ranging from a millisecond to 30 minutes. In one embodiment, the annealing is done by a flash anneal process at about 1200° C. for twenty (20) milliseconds.

In some embodiments in which the gate structure 18 is a sacrificial gate structure, the sacrificial gate structure can now be replaced by a functional gate structure, as described above. The removal of the sacrificial gate structure includes an etching process that forms a gate cavity which can then be filled with a gate dielectric portion and a gate conductor portion. In another embodiment, the sacrificial gate structure can be removed after providing the structure shown in FIGS. 7A-7B. In some embodiments in which a sacrificial gate structure is replaced with a functional gate structure, the gate dielectric material portion is present only within a bottom portion of each gate cavity. In another embodiment of the present application (not shown), the gate dielectric material portion includes vertically extending portions that directly contact exposed vertical sidewalls of each composite spacer structure. In such an embodiment, each vertically extending portion of gate dielectric material portion laterally separates the gate conductor material portion from the vertical sidewall surfaces of the composite spacer structure of the present application.

Figure 7A:
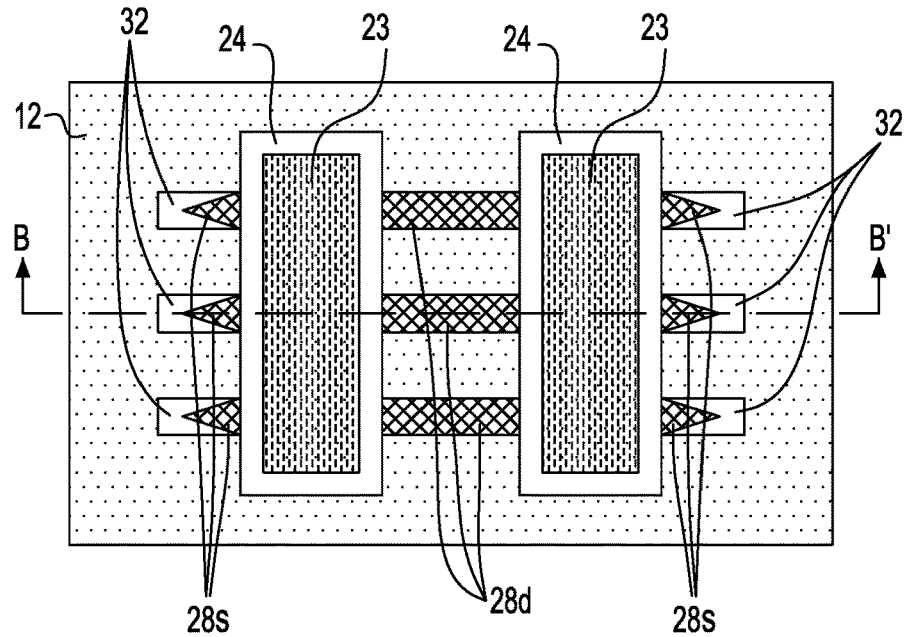
FIG. 7A is a top-down of the exemplary semiconductor structure of FIG. 7A after providing a dielectric material beneath the epitaxial semiconductor material.
Figure 7B:
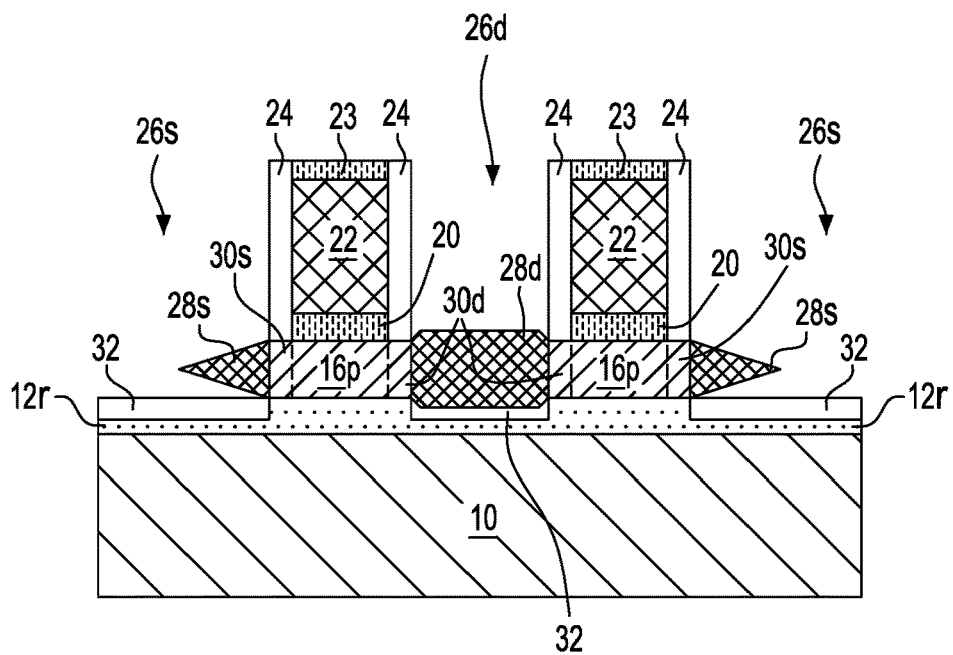
FIG. 7B is a cross sectional view of the exemplary semiconductor structure of FIG. 7A along the vertical plane B-B'.

Referring now to FIGS. 7A-7B, there is illustrated the exemplary structure of FIGS. 6A-6B after providing a dielectric material 32 beneath the doped semiconductor material. The dielectric material 32 may comprise a same or different material than insulator layer 12. The dielectric material 32 is formed on each recessed insulator portion 12r. In some embodiments, and as shown, the dielectric material 32 has an upper surface that is co-planar with an upper surface of each insulator pedestal portion 12p. In other embodiments (not shown), the dielectric material 32 has an upper surface that is vertical offset (either above or below) the upper surface of each insulator pedestal portion 12p. The dielectric material 32 may be formed by a flowable oxide which is formed utilizing methods well known to those skilled in the art.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a FinFET device comprising:
   providing a plurality of semiconductor fins on a surface of an insulator layer;
   forming a plurality of gate structures orientated perpendicular to and straddling each semiconductor fin of said plurality of semiconductor fins;
   providing a dielectric spacer on vertical sidewalls of each gate structure;
   removing, entirely by an anisotropic etch, an entirety of each semiconductor fin and a portion of said insulator layer, not protected by said gate structures and said dielectric spacers, wherein said removing provides semiconductor fin portions located on pedestal insulator portions of said insulator layer;
   forming a source-side doped semiconductor material portion on one exposed vertical sidewall of each semiconductor fin portion and a drain-side doped semiconductor portion on another exposed vertical sidewall of each semiconductor fin portion; and
   diffusing, by annealing, a dopant from said source-side doped semiconductor material portion into each semiconductor fin portion to form a source region along an entirety of said one exposed vertical sidewall of each semiconductor fin portion, and a dopant from said drain-side doped semiconductor material portion into each semiconductor fin portion to form a drain region along an entirety of said another exposed vertical sidewall of each semiconductor fin portion, said source region and said drain region are laterally separated from each other by a channel region of said semiconductor fin portion, and wherein a first junction between the source region and the channel region has a first dopant concentration gradient of less than 6 nm per decade, and a second junction between the drain region and the channel region has a second dopant concentration gradient of less than 6 nm per decade.

2. The method of claim 1, wherein said providing said plurality of semiconductor fins comprises lithography and etching of a semiconductor material layer of a semiconductor-on-insulator substrate.

3. The method of claim 1, wherein each gate structure is a functional gate structure comprising a gate dielectric material portion and a gate conductor material portion.

4. The method of claim 1, wherein each gate structure is a sacrificial gate structure and wherein each sacrificial gate structure is replaced with a functional gate structure after said diffusing.

5. The method of claim 1, wherein said exposed vertical sidewalls of each semiconductor fin portion are vertically coincident with vertical sidewalls of each pedestal insulator portion, and outer sidewalls of each dielectric spacer.

6. The method of claim 1, wherein said forming said source-side doped semiconductor material portion and said drain-side doped semiconductor portion comprises an epitaxial growth process.

7. The method of claim 6, wherein each exposed vertical sidewall of each semiconductor fin portion has a <110> crystal plane and during an initial stage of said epitaxial growth process <111> bound diamond shaped epitaxy is grown around each semiconductor fin portion.

8. The method of claim 6, wherein said epitaxial growth process merges neighboring semiconductor fin portions.

9. The method of claim 1, wherein each source-side doped semiconductor material portion and each drain-side doped semiconductor portion has a non-planar planar upper surface.

10. The method of claim 1, further comprising forming a dielectric material beneath each source-side doped semiconductor material portion and each drain-side doped semiconductor portion and on a recessed surface of a recessed portion of said insulator layer.

11. The method of claim 10, wherein said dielectric material has an upper surface that is coplanar with an upper surface of each pedestal insulator portion.

12. The method of claim 1, wherein said source region and said drain region have a same width as a width of said dielectric spacer.

13. The method of claim 1, wherein said source region, said drain region and said channel region have a topmost surface that is coplanar with each other, and a bottommost surface that is coplanar with each other.

14. The method of claim 1, wherein said annealing is a thermal anneal that is performed at a temperature from 600° C. to 1300° C. and for a duration of a millisecond to 30 minutes.

15. The method of claim 1, wherein said annealing is a flash anneal performed at about 1200° C. for a duration of 20 milliseconds.

16. The method of claim 1, wherein said annealing is a laser anneal.

17. The method of claim 1, wherein said first and second dopant concentration gradients are both less than 4 nm per decade.

* * * * *